(12) United States Patent
Shih

(10) Patent No.: US 6,396,693 B1
(45) Date of Patent: May 28, 2002

(54) HEAT SINK

(76) Inventor: Ming Fa Shih, No. 17, His Ti Liao, Ming Hsiung Hsiang, Chia Yi Hsien (TW)

( * ) Notice: Subject to any disclaimer, the term of this patent is extended or adjusted under 35 U.S.C. 154(b) by 0 days.

(21) Appl. No.: 09/855,494

(22) Filed: May 16, 2001

(30) Foreign Application Priority Data

Aug. 24, 2000 (TW) ..................................... 89214627 U

(51) Int. Cl.⁷ ................................................ H05K 7/20
(52) U.S. Cl. ..................................................... 361/703
(58) Field of Search ................................ 257/718, 719, 257/722, 726, 727; 165/80.3, 185; 174/16.3; 361/687, 703, 704, 717–719, 709–712; 267/150, 158, 160

(56) References Cited

U.S. PATENT DOCUMENTS

| | | | | |
|---|---|---|---|---|
| 4,800,956 A | * | 1/1989 | Hamburgen | 165/185 |
| 5,838,065 A | * | 11/1998 | Hamburgen et al. | 257/722 |
| 5,912,802 A | * | 6/1999 | Nelson | 361/695 |
| 6,009,938 A | * | 1/2000 | Smith et al. | 165/185 |
| 6,062,301 A | * | 5/2000 | Lu | 165/80.3 |

* cited by examiner

Primary Examiner—Gerald Tolin
(74) Attorney, Agent, or Firm—Bacon & Thomas, PLLC

(57) ABSTRACT

A heat sink includes a bottom heat sink unit having parallel upright fins, and a top heat sink unit having parallel bottom fins respectively forced into engagement with the upright fins of the bottom heat sink at one side, and two hook plates respectively hooked in respective mounting grooves on the bottom heat sink unit and the top heat sink unit to secure the two heat sink units together.

3 Claims, 5 Drawing Sheets

HEAT SINK

BACKGROUND OF THE INVENTION

The present invention relates to a heat sink adapted to dissipate heat from a CPU.

In order to enhance the heat dissipation n efficiency of a heat sink, the heat dissipation area must be relatively increased. FIG. 1 shows a heat sink according to the prior art. This structure of heat sink is extruded from aluminum, comprising a flat bottom panel 11 and parallel radiation fins 12 perpendicularly extended from the top surface of the flat bottom panel 11. In order to increase the heat dissipation area, the radiation fins 12 are made as longer as possible. However, due to aluminum extrusion technical problem, there is a limitation to the length of the radiation fins 2.

SUMMARY OF THE INVENTION

The present invention has been accomplished under the circumstances in view. It is the main object of the present invention to provide a heat sink, which provides a big heat dissipation area to dissipate heat efficiently. According to one aspect of the present invention, the heat sink comprises a bottom heat sink unit having parallel upright fins, and a top heat sink unit having parallel bottom fins respectively forced into engagement with the upright fins of the bottom heat sink, and two hook plates respectively hooked in respective mounting grooves on the bottom heat sink unit and the top heat sink unit to secure the two heat sink units together. According to another aspect of the present invention, the top heat sink unit has a circular top recess and two locating grooves at two sides of the circular top recess for the mounting of a fan.

DETAILED DESCRIPTION OF THE PREFERRED EMBODIMENT

Figure 1:
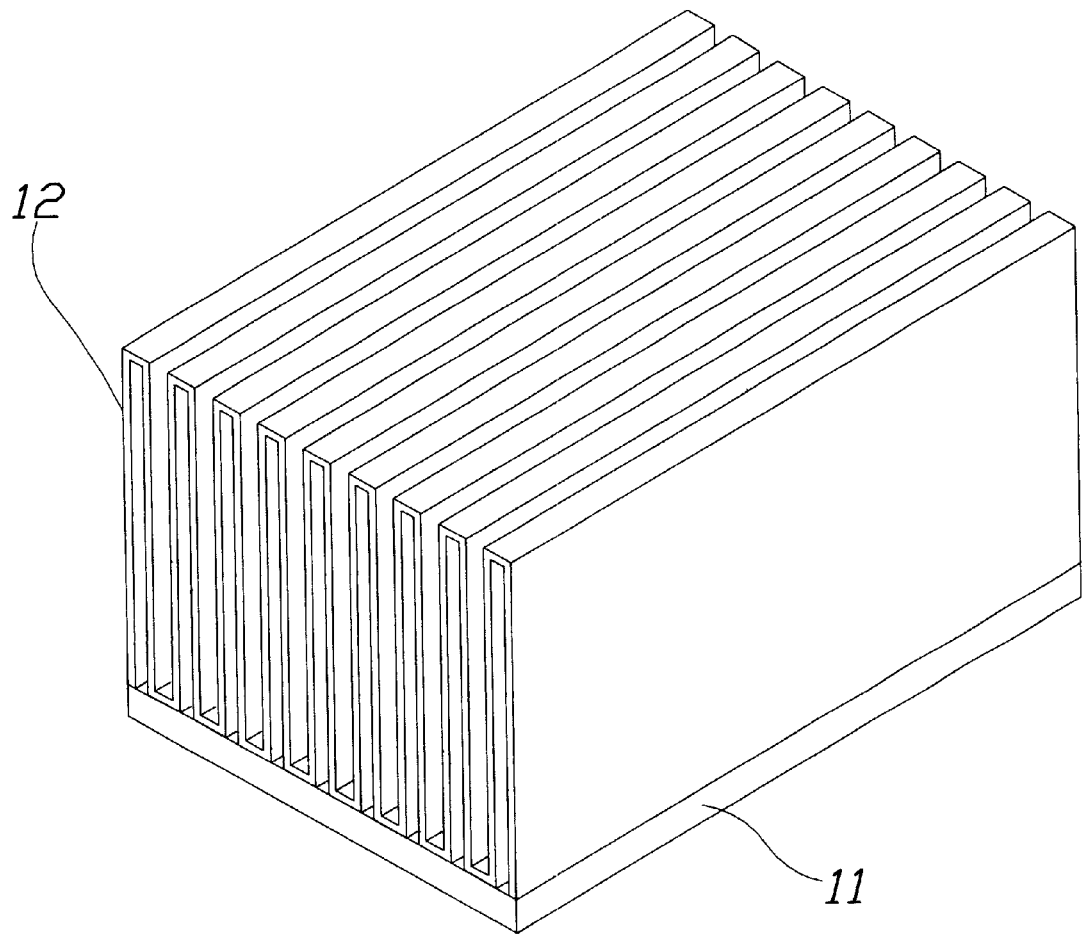
FIG. 1 is an elevational view of a heat sink according to the prior art.
Figure 2:
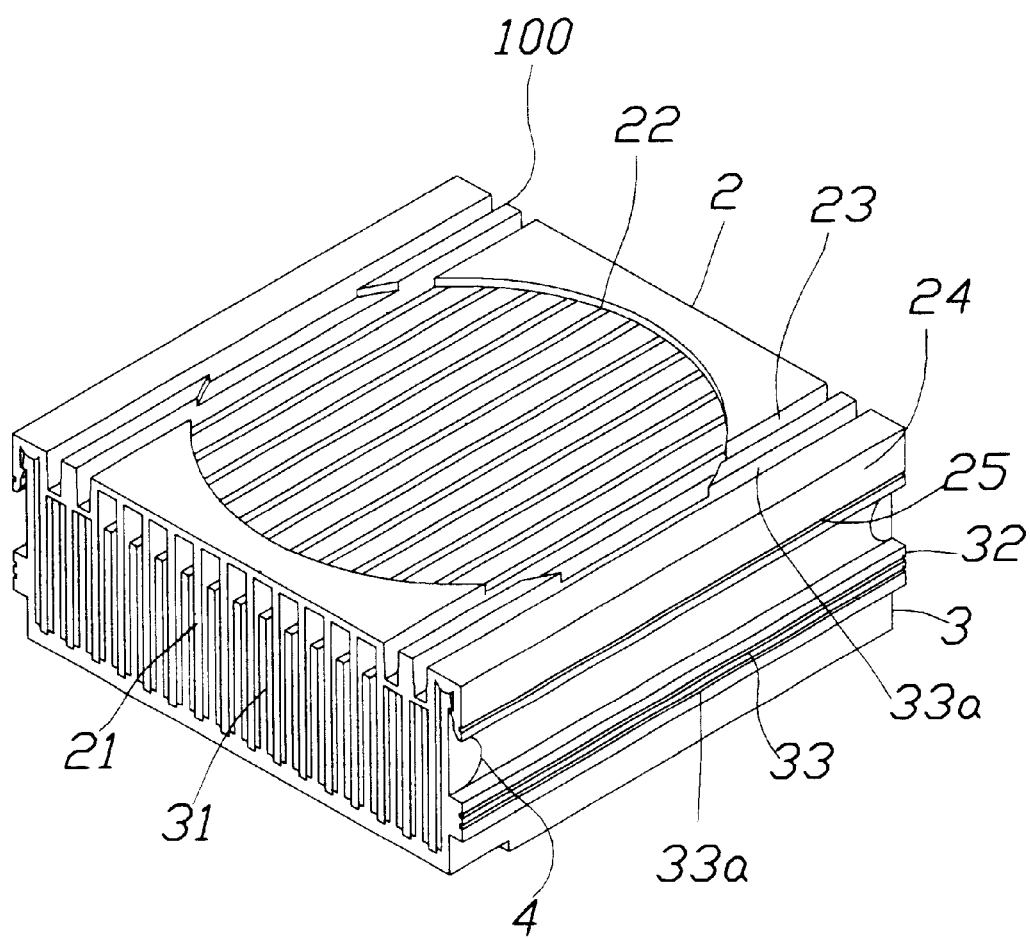
FIG. 2 is an elevational view of a heat sink according to a first embodiment of the present invention.
Figure 3:
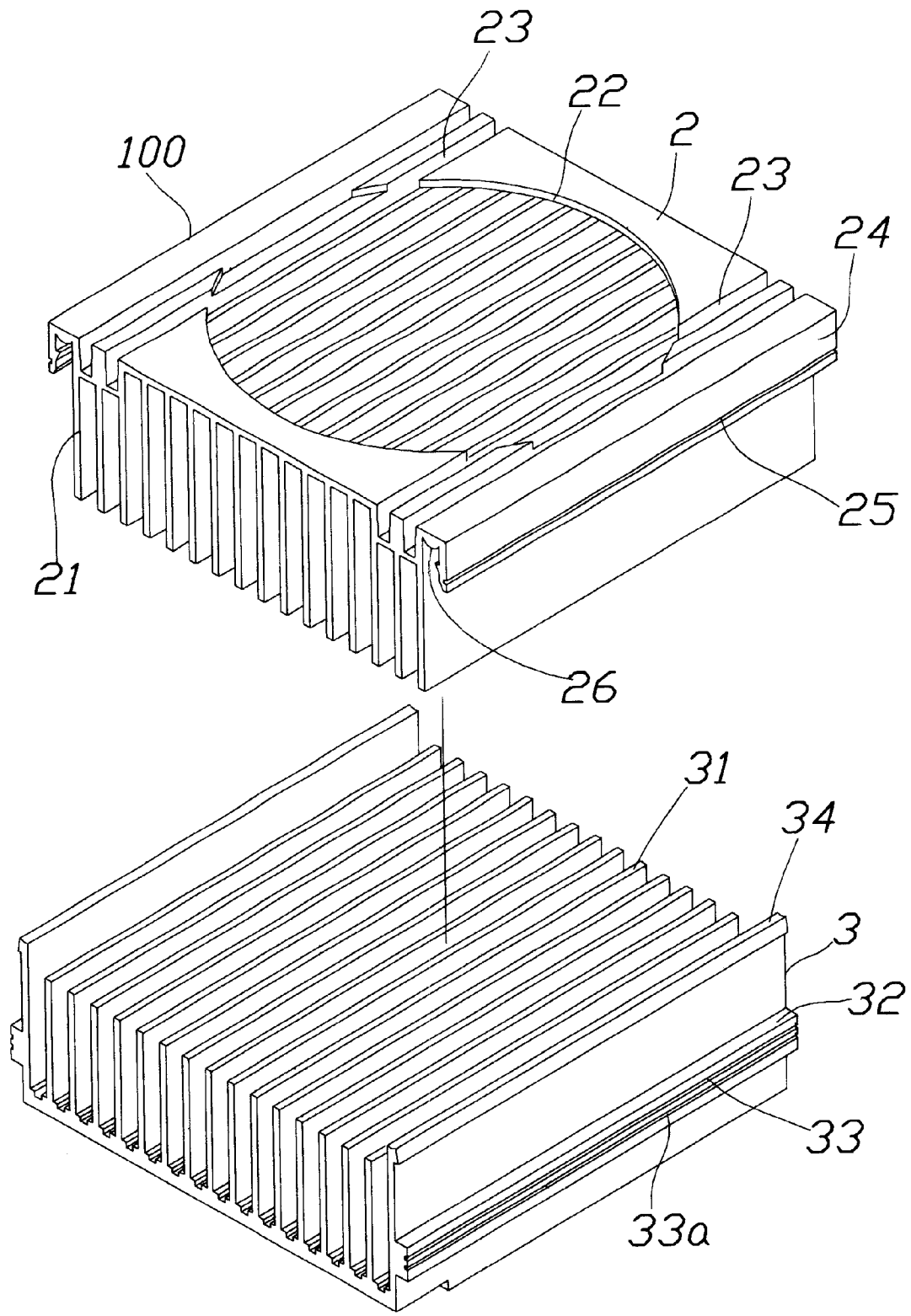
FIG. 3 is an exploded view of the heat sink shown in FIG. 2.

Referring to FIGS. 2 and 3, a heat sink 100 is shown generally comprised of a top heat sink unit 2, and a bottom heat sink unit 3. The top heat sink unit 2 comprises a plurality of transversely extended bottom fins 21, a circular top recess 22 disposed at the center of the top sidewall thereof and adapted to receive a fan (not shown), two top locating grooves 23 transversely disposed at the top sidewall and cut through the border of the circular top recess 22 at two opposite sides and adapted to receive tie screws that fasten the fan to the circular top recess 22, and two coupling flanges 24 transversely disposed at two opposite lateral sides. The coupling flanges 24 each have a horizontal mounting groove 25. The bottom heat sink unit 3 comprises a transversely extended upright fins 31, and two side rails 32 transversely disposed at two opposite lateral sides, The side rails 32 each comprises two horizontal mounting grooves 33;33a disposed at different elevations. During assembly process of the heat sink 100, the transversely extended bottom fins 21 of the top heat sink unit 2 are respectively vertically inserted into gaps in between the transversely extended upright fins 31 of the bottom heat sink unit 3 from the top side, permitting the bottom fins 21 of the top heat sink unit 2 to be respectively forced into engagement with the upright fins 31 of the bottom heat sink unit 3 at one side, and then two hook plates 4 are respectively hooked in the horizontal mounting groove 25 of each of the coupling flanges 24 and the upper horizontal mounting grooves 33 of each of the side rails 32 to secure the top heat sink unit 2 and the bottom heat sink unit firmly together. During installation of the heat sink 100, clamp means or the like is fastened to the lower horizontal mounting grooves 33a of each of the side rails 32 to secure the heat sink 100 to the CPU module. Furthermore, the first and last upright fins 31 of the bottom sink heat unit 3 are relatively taller than the other upright fins, each having a positioning groove in the topmost edge. The coupling flanges 24 each have a positioning rib 26 respectively engaged into the positioning groove 34 in the topmost edge of each of the first and last upright fins 31 of the bottom heat sink unit 3.

Figure 4:
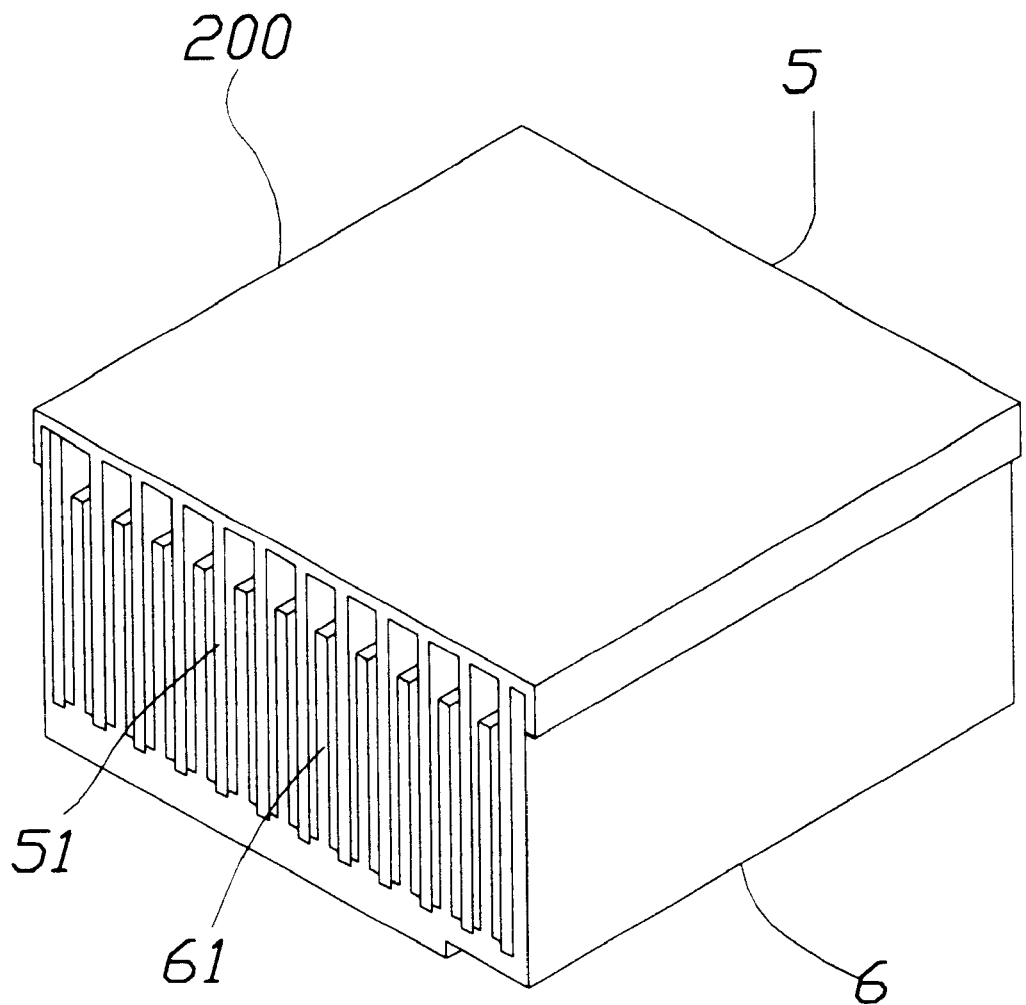
FIG. 4 is an elevational view of a heat sink according to a second embodiment of the present invention (before processing of the top heat sink unit).
Figure 5:
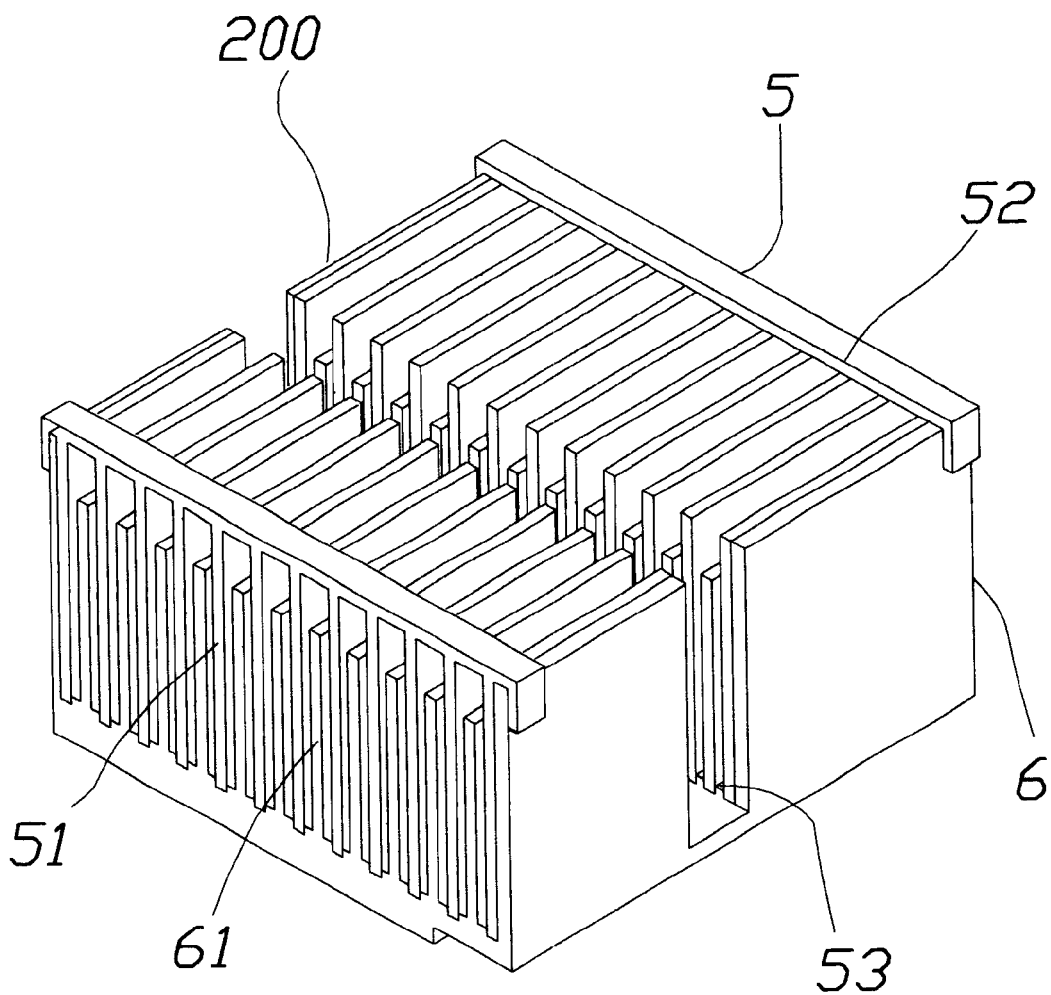
FIG. 5 is an elevational view of the heat sink of the second embodiment of the present invention, showing the top heat sink unit processed.

FIGS. 4 and 5 show a heat sink 200 according to a second embodiment of the present invention. The heat sink 200 is comprised of a top heat sink unit 5 and a bottom heat sink unit 6. The top heat sink unit 5 comprises a plurality of transversely extended bottom fins 51. The bottom heat sink unit 6 comprises a plurality of transversely extended upright fins 61 respectively forced into engagement with the bottom fins 51 of the top heat sink unit 5. When assembled, the top heat sink 5 is processed to provide top peripheral ribs 52 and a longitudinally extended middle mounting groove 53 for receiving fastener means adapted to secure the heat sink 200 to the CPU module.

A prototype of heat sink has been constructed with the features of FIGS. 2~5. The heat sink functions smoothly to provide all of the features discussed earlier.

Although particular embodiments of the invention have been described in detail for purposes of illustration, various modifications and enhancements may be made without departing from the spirit and scope of the invention. Accordingly, the invention is not to be limited except as by the appended claims.

What the invention claimed is:

1. A heat sink comprising:

a bottom heat sink unit, said bottom heat sink unit comprising a plurality of transversely extended upright fins, and two side rails transversely disposed at two opposite lateral sides thereof, said side rails each comprising a first horizontal mounting groove, and a second horizontal mounting groove for receiving fastener means adapted to secure said bottom heat sink unit to a CPU module;

a top heat sink unit fastened to said bottom heat sink unit at a top side, said top heat sink unit comprising a plurality of transversely extended bottom fins respectively forced into engagement with the upright fins of said bottom heat sink unit at one side, a circular top recess disposed at the center of a top sidewall thereof and adapted to receive a fan, two top locating grooves transversely disposed at the top sidewall and cut through the border of said circular top recess at two opposite sides and adapted to receive tie screws that fasten a fan to said circular top recess, and two coupling flanges transversely disposed at two opposite lateral sides and respectively coupled to first and last upright fins of said bottom heat sink unit, said coupling flanges each having a horizontal mounting groove; and two hook plates respectively hooked in the horizontal mounting groove of each of said coupling flanges and the first horizontal mounting grooves of each of said side rails to secure the top heat sink unit and said bottom heat sink unit together.

2. The heat sink of claim 1 wherein the first and last upright fins of said bottom heat sink unit each comprises a positioning groove in the respective topmost edge, and said coupling flanges of said top heat sink unit each have a positioning rib respectively engaged into the positioning groove in the topmost edge of each of the first and last upright fins of said bottom heat sink unit.

3. A heat sink comprising:

a bottom heat sink unit, said bottom heat sink unit comprising a plurality of transversely extended upright fins, and a longitudinal mounting groove cut through said upright fins on the middle; and a top heat sink unit fastened to said bottom heat sink unit at a top side, said top heat sink unit comprising a plurality of transversely extended bottom fins respectively forced into engagement with the upright fins of said bottom heat sink unit at one side, a longitudinal mounting groove cut through said bottom fins on the middle and fitting the longitudinal mounting groove of said bottom heat sink unit for mounting, and a plurality of peripheral ribs disposed at a top side.

* * * * *